(12) United States Patent
Henzler

(10) Patent No.: US 8,064,561 B2
(45) Date of Patent: Nov. 22, 2011

(54) DETERMINING A TIME INTERVAL BASED ON A FIRST SIGNAL, A SECOND SIGNAL, AND A JITTER OF THE FIRST SIGNAL

(75) Inventor: Stephan Henzler, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 1047 days.

(21) Appl. No.: 11/856,046

(22) Filed: Sep. 16, 2007

(65) Prior Publication Data

US 2009/0074124 A1    Mar. 19, 2009

(51) Int. Cl.
*H04L 7/00* (2006.01)

(52) U.S. Cl. ........................................ 375/371

(58) Field of Classification Search ............... 375/224, 375/226–227, 371; 370/76.19, 76.21, 76.22, 370/105.3, 516; 348/497; 369/53.34; 324/76.11, 324/76.82, 500, 512, 535
See application file for complete search history.

(56) References Cited

U.S. PATENT DOCUMENTS

| | | | |
|---|---|---|---|
| 6,983,394 B1 * | 1/2006 | Morrison et al. | 713/500 |
| 7,433,286 B2 * | 10/2008 | Ogura et al. | 369/53.34 |
| 7,804,290 B2 * | 9/2010 | Henzler et al. | 324/76.82 |
| 2007/0147490 A1 * | 6/2007 | Okamoto et al. | 375/232 |
| 2008/0123786 A1 * | 5/2008 | Wongwirawat et al. | 375/346 |
| 2009/0028274 A1 * | 1/2009 | Kim et al. | 375/340 |
| 2009/0072812 A1 * | 3/2009 | Henzler et al. | 324/76.82 |
| 2009/0153377 A1 * | 6/2009 | Chang | 341/53 |

* cited by examiner

*Primary Examiner* — Tesfaldet Bocure
*Assistant Examiner* — Lawrence Williams
(74) *Attorney, Agent, or Firm* — Banner & Witcoff, Ltd.

(57) ABSTRACT

An apparatus including a circuit configured to determine a jitter of a first signal, and to determine a time interval between a feature in a second signal and a feature in the first signal based on the determined jitter.

25 Claims, 4 Drawing Sheets

Figure 1:
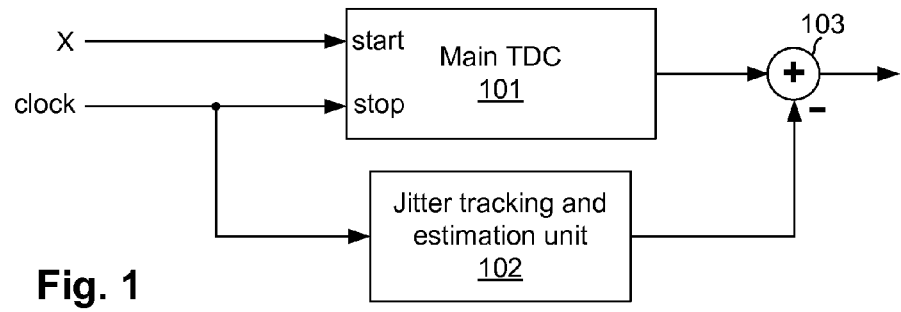

DETERMINING A TIME INTERVAL BASED ON A FIRST SIGNAL, A SECOND SIGNAL, AND A JITTER OF THE FIRST SIGNAL

BACKGROUND

There are many applications in which high resolution measurement of a time interval is useful. For example, accurate time interval measurement is often used in various high resolution measurement and instrumentation applications, in analog-to-digital converters based on pulse-width modulation, in phase detectors of digital phase-locked loops, and in mass spectrometer time-of-flight measurements. The industry-wide trend to replace more analog, mixed signal, and radio frequency functionality with increasingly faster digital solutions further enhances the need for high-resolution time measurement.

Time-to-digital converters (TDCs) are often used for such accurate time measurements. The resolution of state of the art in a contemporary 90 nm integrated circuit technology reaches values on the order of picoseconds.

The stop signal of a TDC is typically a periodic reference clock signal that is inevitably disturbed by jitter. If the jitter is on the order of the time resolution of the TDC, or even larger, the effective resolution is thus limited by the clock jitter. It is expected that the resolution may improve with further technology scaling resulting in the reduced gate delays. Unfortunately, clock jitter does not scale with technology. Thus, as the potential resolution of TDCs improves, the relative limiting effect of clock jitter increases.

In principle, it is possible to reduce clock jitter to some extent (although there are limitations because jitter cannot be reduced to zero). However, measures to reduce jitter usually involve a significant amount of added cost, both in terms of integrated circuit area used as well as power consumption. Thus, a more jitter-tolerant TDC may be desirable not only to push the absolute resolution limit of TDCs but also to relax the jitter requirements of the reference clock generator.

SUMMARY

Various aspects are described herein. For example, various illustrative embodiments of an apparatus are described having a circuit configured to determine a jitter of a first signal, and to determine a time interval between a feature in a second signal and a feature in the first signal based on the determined jitter. Various illustrative embodiments of methods performed by such apparatuses are also described.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein:

FIG. 1 is a schematic diagram of an illustrative embodiment of a device for time-to-digital conversion that performs clock-jitter compensation;

FIG. 2 is a schematic diagram of the device of FIG. 1 showing an illustrative embodiment of details of the jitter tracking and estimation unit;

FIG. 3 is a schematic diagram of an illustrative embodiment of a time-to-digital converter; and FIG. 4 is a schematic diagram of the device of FIG. 2 showing an illustrative embodiment of details of the jitter estimation unit.

FIG. 5 is a schematic diagram of an illustrative variation of the device of FIG. 4, where the same TDC is used to perform both input signal measurement and jitter tracking.

FIG. 6 is a schematic diagram of an illustrative variation of the device of FIG. 1, where auxiliary TDCs are used that are of a type that do not acquire multiple time intervals in the past and/or that are not configurable to be started and stopped simultaneously.

DETAILED DESCRIPTION

The various aspects described herein may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled," "connected," and "interconnected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements.

FIG. 1 shows an illustrative embodiment of a device that is able to measure time intervals of a signal using a reference clock, while at least partially compensating for reference clock jitter. In the example of FIG. 1, the device includes a main TDC 101 and a jitter tracking and estimation unit 102. Main TDC 101 includes a start input coupled to a signal X and a stop input coupled to a reference clock signal. Jitter tracking and estimation unit has an input coupled to the reference clock signal, but does not necessarily receive signal X.

The output of main TDC 101 represents a time interval that includes at least a time interval between a feature in signal X and the occurrence of a later-occurring reference clock cycle. The output of jitter tracking and estimation unit 102 represents a determined amount of jitter in the reference clock signal. Accordingly, any jitter in the reference clock signal will introduce an error in the time interval determined by main TDC 101. If the clock cycle is too short, then the measured time interval will be erroneously short, and if the reference clock cycle is too long, then the measured time interval will be erroneously long.

The feature in signal X may be, for example, a transition (such as a transition from logical zero to logical one, or vice versa), a spike, the crossing of a predetermined reference level, and/or the occurrence of a signal change having a least a predetermined rate of change. The output of main TDC 101 may be in any format, for example formatted as a pseudo thermometer code. The outputs of main TDC 101 and jitter tracking and estimation unit 102 are combined by a combiner 103, such that the determined amount of jitter appropriately offsets the determined time interval. This offset may improve the overall accuracy of the final time interval determination by at least partially compensating for jitter of the reference clock signal.

For purposes of this disclosure, a combiner (such as combiner 103) is any type of circuitry or other device that receives at least two signals representing values, that combines the values represented by those signals, and outputs the combined value as a signal. A combiner may combine those signals in any manner desired, such as by adding the values, subtracting one value from another, dividing the values, multiplying the values, and/or performing any other mathematical combination of the values. The appropriate combination of signals depends upon what each signal conceptually represents. For example, in the embodiment of FIG. 1, combiner 103 subtracts the value represented by the signal output from jitter tracking and estimation unit 102 from the value represented by the signal output from main TDC 101. In such a case, it is assumed that the value from jitter tracking and estimation unit 102 represents elongated reference clock periods as positive jitter and shortened reference clock periods as negative jitter. However, where the opposite is true, then it may be appropriate for combiner 103 to sum the values rather than to subtract the values.

Figure 2:
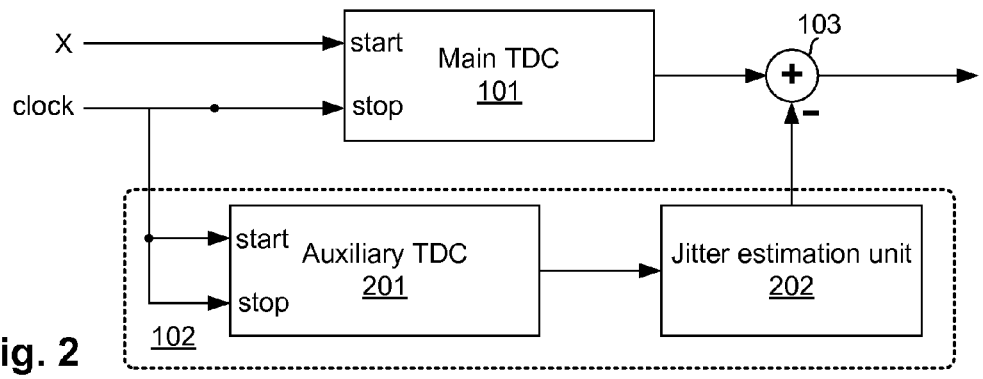

Further details of jitter tracking and estimation unit 102 are shown in the illustrative embodiment of FIG. 2. In this example, jitter tracking and estimation unit 102 includes an auxiliary TDC 201 and a jitter estimation unit 202. Auxiliary TDC 201 may be the same type of TDC as main TDC 101 or a different type. Auxiliary TDC 201 has a start input and a stop input, both connected to receive the reference clock signal as shown. Thus, auxiliary TDC 201 may indicate a time interval defined between two events in the reference clock signal. For example, auxiliary TDC 201 may indicate the current period of the reference clock signal. Due to jitter, the period of the reference clock signal may vary over time.

Jitter estimation unit 202 receives the output of auxiliary TDC 201 (which may be, for example, a pseudo thermometer code), and determines the jitter of the reference clock signal from this output. The determined jitter may or may not represent the actual jitter of the reference clock signal exactly, and so the determined jitter may also be considered an estimated jitter. As will be described in further detail below, jitter estimation unit 202 may determine jitter based not only on the current output from auxiliary TDC 201, but also from one or more previous outputs from auxiliary TDC 201. For example, based on one or more outputs over time from auxiliary TDC 201 indicating a period of the reference clock signal, jitter estimation unit 202 may determine the jitter in the reference clock signal period. The determined jitter may then be output by jitter estimation unit 202 and combined in the manner previously described.

Figure 3:
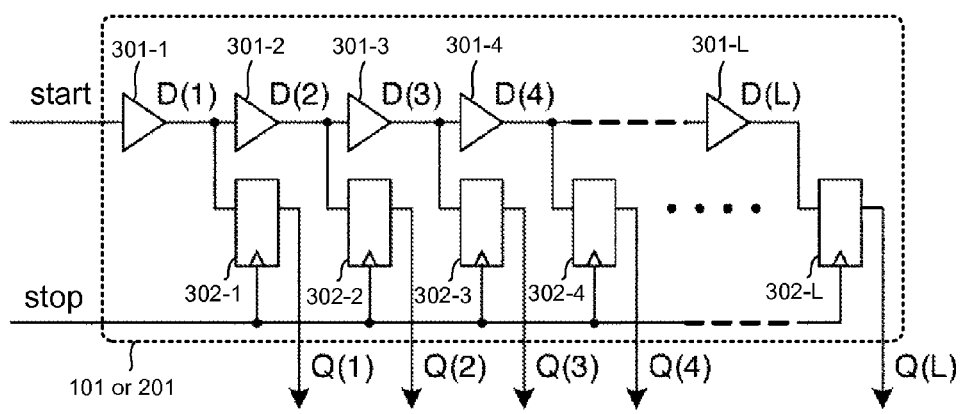

An illustrative embodiment of a TDC is shown in FIG. 3, which may be used as main TDC 101 and/or auxiliary TDC 201. In this example, the signal at the start input propagates through a delay chain made up of a plurality of L nodes D(1), D(2), . . . D(L) in series and separated by delay elements 301-1, 301-2, . . . 301-L. Each delay element may be any circuit element that delays the propagation of the signal, such as but not limited to one or more logic gates (e.g., an OR gate, or one or more inverters), buffers, amplifiers, or delay trace lines. Each delay element may produce a predetermined known delay.

Each node in the chain is further connected to the data input of a respective latch 302-1, 302-2, . . . 302-L, as shown. Each latch 302 is clocked to the signal received at the stop input, and each latch 302 has a respective data output Q(1), Q(2), . . . Q(L). Thus, in operation, as the signal from the start input propagates through the delay chain, the signal from the stop input may be used as a trigger to take a snapshot of the signal values at each node, which are output on lines Q in response to the signal at the stop input. Thus, the signal at the start input acts effectively as a "start" signal for time interval measurement, and the signal at the stop input effectively acts as a "stop" signal.

Outputs Q(1) through Q(L) may collectively represent a series of data bits that together may represent the time interval measured (referred to as a pseudo thermometer code). Proper interpretation of outputs Q(1) through Q(L) is a known process and thus does not need to be described in detail herein.

There are many known variations on the type of TDC shown in FIG. 3. For instance, delay chains may be linear as shown or in the form of an endless loop. Also, other types of TDCs are known such as parallel scaled delay chain TDCs, regular and folded Vernier delay-chain TDCs, hybrid TDCs, pulse-shrinking TDCs, and local passive interpolation TDCs. Although FIG. 3 shows a particular type of delay chain TDC, any type of TDC as appropriate may be used as TDC 101 and/or 201 in the various embodiments described herein.

Referring again to FIG. 2, the device illustrated therein may operate as follows. A first feature (e.g., signal transition or spike) of signal X may be received at the start input of main TDC 101. This first feature may propagate through main TDC 101, such as through nodes D. Later, a second feature of signal X may be received at the start input of main TDC 101. This second feature may also propagate through main TDC 101 in the same way as the first feature. Upon the next reference clock cycle, the signal levels at nodes D are output at outputs Q. By appropriately interpreting outputs Q as each reference clock cycle causes outputs Q to be updated, the time interval between the first feature of signal X and the reference clock cycle immediately following the second feature of signal X, and/or the time interval between the second feature and the immediately following reference clock cycle, may be determined.

For instance, many TDCs product a pseudo thermometer code (which may be produced at outputs Q) in which the zero-one and one-zero signal transitions indicate the position of a signal edge. The locations of these signal transitions within outputs Q may be used to determine the time interval being measured, whether the time interval results from a measurement of signal X or a measurement of the reference clock signal.

Regardless of the particular interval measurement being taken, the accuracy of the time interval measurement depends upon the steadiness of the reference clock signal period. Thus, in parallel with main TDC 101, auxiliary TDC 201 receives the reference clock signal at both its start and stop inputs. Thus, in the same manner as described above with regard to main TDC 101, auxiliary TDC 201 may determine a time interval between first and second features of the reference clock signal. For example, auxiliary TDC 201 may determine a time interval between two signal transitions, or two spikes, or between any two other features, of the reference clock signal.

This time interval based on the reference clock signal is repeatedly and/or continuously determined by auxiliary TDC 201, and signals representing these multiple determined time intervals are fed into jitter estimation unit 202, which in turn interprets the output of auxiliary TDC 201 and determines a variation in the determined time intervals.

Figure 4:
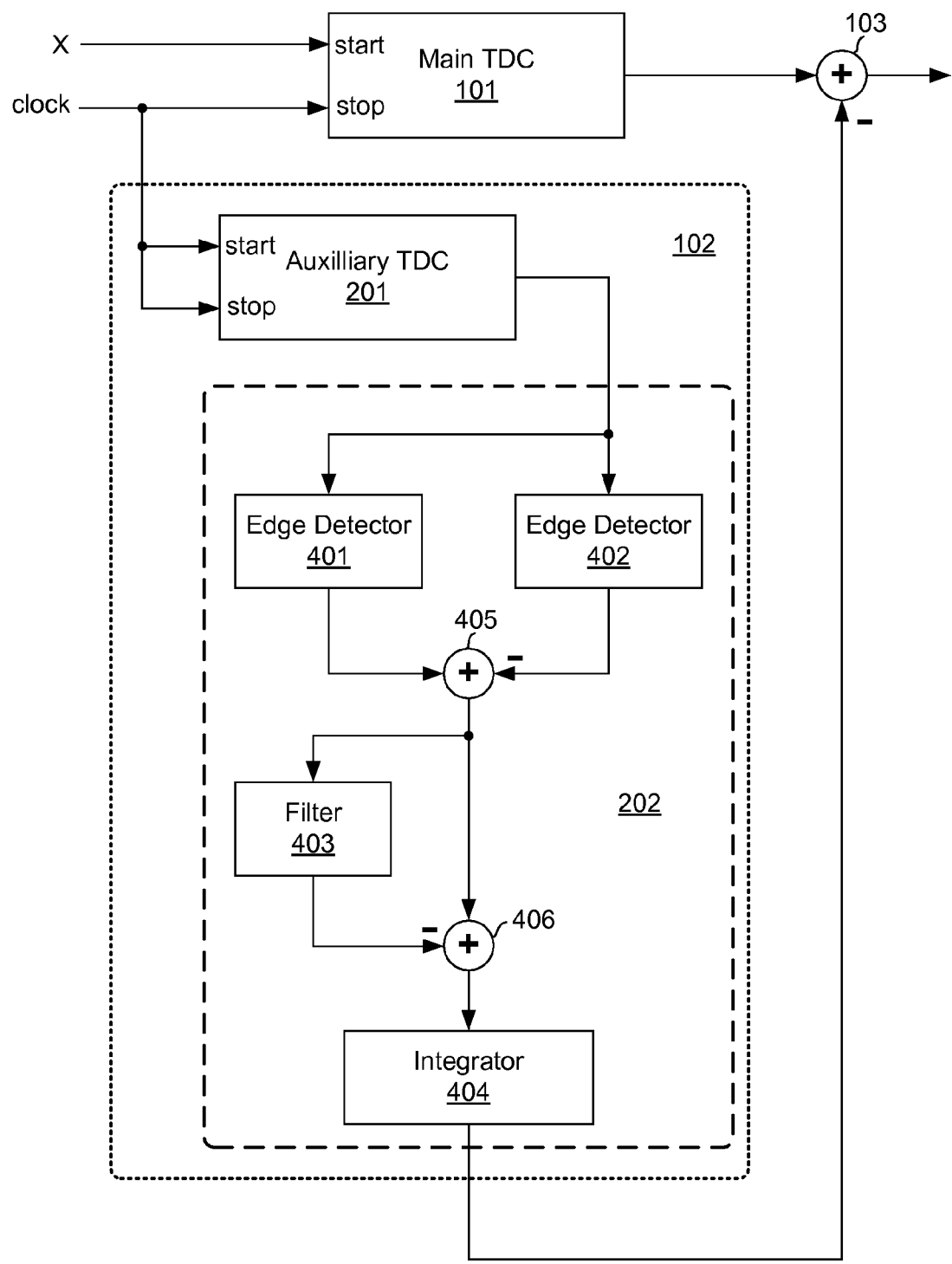

FIG. 4 shows the previously-described device, with an illustrative detailed embodiment of jitter estimation unit 202. In this example, jitter estimation unit 202 includes an edge detector 401, an edge detector 402, a filter 403, and an integrator 404.

In the present embodiment, it will be assumed that auxiliary TDC 201 is of a type that outputs a pseudo thermometer code, in which zero-one and on-zero transitions indicate the position of a signal edge in input signal X. Thus, two edge detectors 401, 402 and combiner 405 are used in this example as reformatting circuitry to interpret and reformat the output of auxiliary TDC 201 by extracting the position of two successive rising (or falling) edges. Moreover, other types of circuitry may be used depending upon the type of auxiliary TDC. For example, where auxiliary TDC 201 delivers the position of a transition directly in binary form, an edge detector may not be needed, and instead another TDC may be used.

In other embodiments, TDC 201 may be a cyclical TDC such as a pulse-shrinking TDC. In such embodiments, additional logic may be applied at the inputs of auxiliary TDC 201 that multiplexes a first rising (or falling) edge of the stop signal to the start input of auxiliary TDC 201 and a subsequent rising (or falling) edge to the stop input of auxiliary TDC 201. Moreover, in such embodiments, two auxiliary TDCs may be used for continuous measurement of the reference clock period, as will be discussed by way of example with regard to FIG. 6.

Returning to the particular embodiment shown in FIG. 4, the difference between the first and second edge positions in the pseudo thermometer code output of auxiliary TDC 201 digitally represents the current period of the reference clock signal. Thus, as shown in FIG. 4, the represented positions may be combined by a combiner 405 such as by subtracting one position from the other to obtain the position difference that represents the current reference clock period.

Next, the resulting combination of outputs of edge detectors 401 and 402 (which may represent the presently determined, or momentary, clock period) is filtered by filter 403. Filter 403 may be any type of digital and/or analog filter. However, where filter 403 is a low-pass filter, then the final jitter determination may be smoothed. Assuming in this example that filter 403 is a digital low-pass filter, then filter 403 effectively takes into account not only the current position difference data but also one or more previous position differences. For instance, for each unfiltered clock period value received, filter 403 may output a filtered clock period value based on a moving window of input unfiltered clock period values.

Averaging of the momentary clock period may result in an estimated value of the actual (i.e., nominal) clock period not overlaid by jitter. The reason for this is the fact that the jitter itself has a zero mean value. The subtraction of the average clock period from the momentary measurement value of the clock period provides the momentary clock period error. Thus, as shown in FIG. 4, the time-averaged output of filter 403 is subtracted from (or otherwise combined with) the momentary period value by a combiner 406, resulting in the momentary clock period error.

This momentary clock period error is then input into integrator 404, which integrates the momentary clock period errors, thereby resulting in the momentary jitter value. Integrator 404 may also be considered a low-pass filter that provides a damping effect on the momentary clock period errors by considering not only the present momentary clock period error but also one or more past momentary clock period errors. A small damping by integrator 404 may reduce or even avoid the possibility of initial values or extreme time measurement errors having an enduring impact on the jitter estimation.

The embodiment shown in FIG. 3 may be used both for random jitter and non-random jitter. In general, jitter may be considered to be random. This is especially true where the reference clock period changes from clock period to clock period, because the jitter for each clock period may be unpredictable and thus uncorrelated with the jitter for any other clock period.

However, where the jitter is due to a low-frequency cause, then the jitter for one reference clock period may not change much, if at all, compared with the jitter for the very next reference clock period. In other words, the jitter for a given clock period may be somewhat correlated (and thus somewhat predictable) based on the jitter from one or more previous clock periods. This is because the jitter value may change slowly relative to the reference clock frequency.

Figure 5:
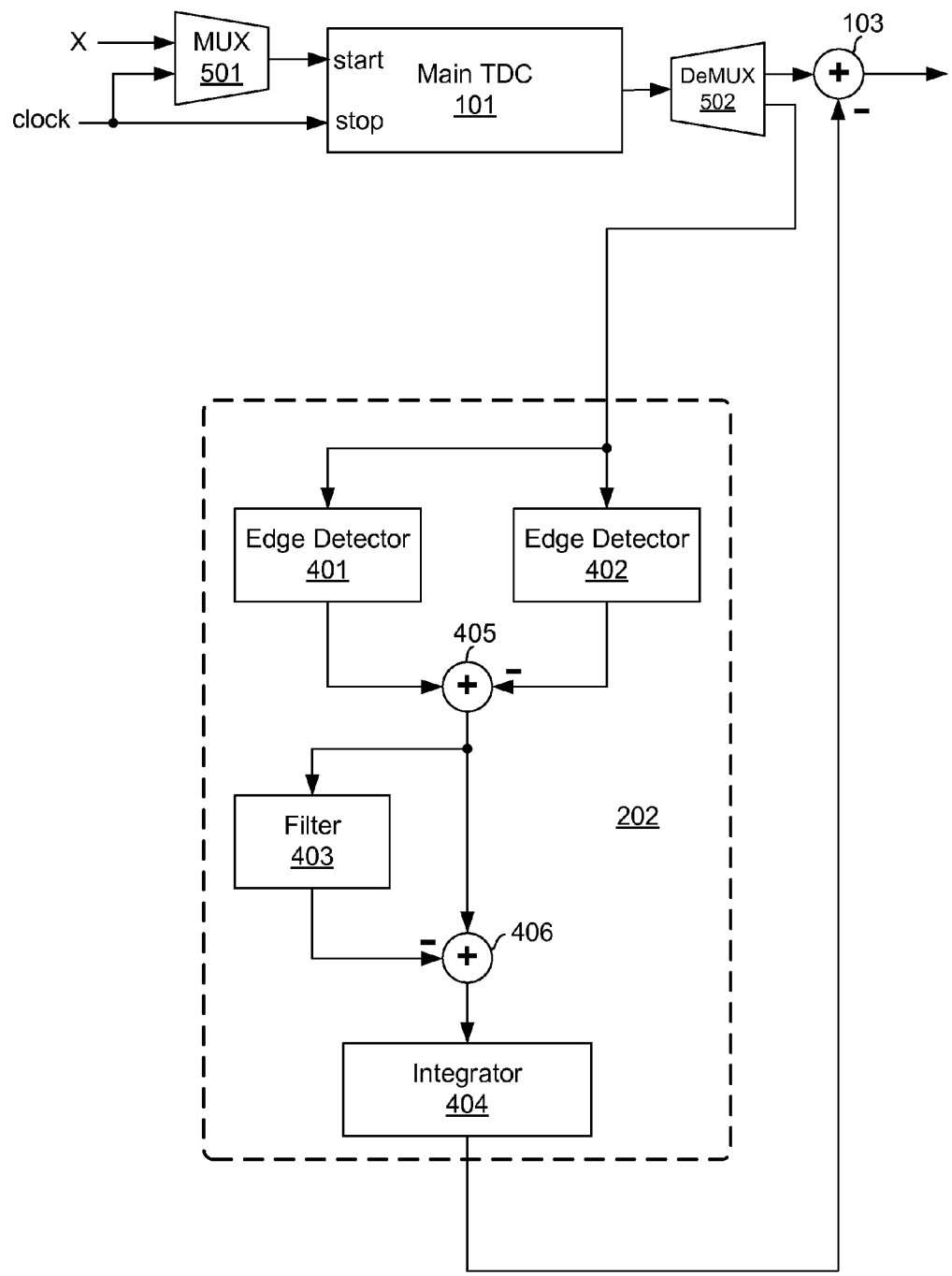

In such situations where the jitter is correlated from cycle to cycle in the reference clock, it may be desirable to use main TDC 101 to perform the functions of both main TDC 101 and auxiliary TDC 201. This may be accomplished by multiplexing the start input of main TDC 101, for example, to alternate between signal X and the reference clock signal. Likewise, the output of TDC 101 may be demultiplexed, for example, to alternate between outputting to combiner 103 and outputting to edge detectors 401 and 402. An example of this is shown in FIG. 5, where a multiplexer 501 and a demultiplexer 502 are used. In such an example, a time interval in signal X is measured during a first clock period, and during a subsequent second clock period the jitter is measured. Because the jitter may be slowly changing, it may be assumed that the jitter for the first reference clock period is the same as the jitter measured for the second reference clock period, or is otherwise predictable from the jitter measured from the second reference clock period (and/or from the jitter measured during one or more other reference clock periods). The reverse may alternatively be performed, where the jitter is measured during the first reference clock period and the signal X interval is measured during the subsequent second reference clock period. In such a case, the jitter may be assumed to be equal to or otherwise predictable from the jitter measured during the first reference clock period (and/or from the jitter measured during one or more other reference clock periods).

In any of the previously-described embodiments, the various elements are shown in the figures schematically as separate units performing unique functions. However, such a division is merely for the purpose of explanation of the various functions performed by the devices. Any of these functions may be combined to be performed by the same units and/or may be further subdivided to be performed by multiple units. Moreover, the various signals communicated between the various functional blocks and/or units may be in any form and format, and may be interpreted by the sender and recipient as digital or analog signals. Moreover, while certain signals are discussed as representing values, the values represented by such signals may be represented directly or indirectly by these signals, such as by being encoded in the signals. An example of such encoding is where a pseudo thermometer code can be used to represent times and/or time intervals. As another example, looped TDCs may produce a binary word representing the most significant portion of the time interval an a remainder described by a pseudo thermometer code representing the least significant portion.

Figure 6:
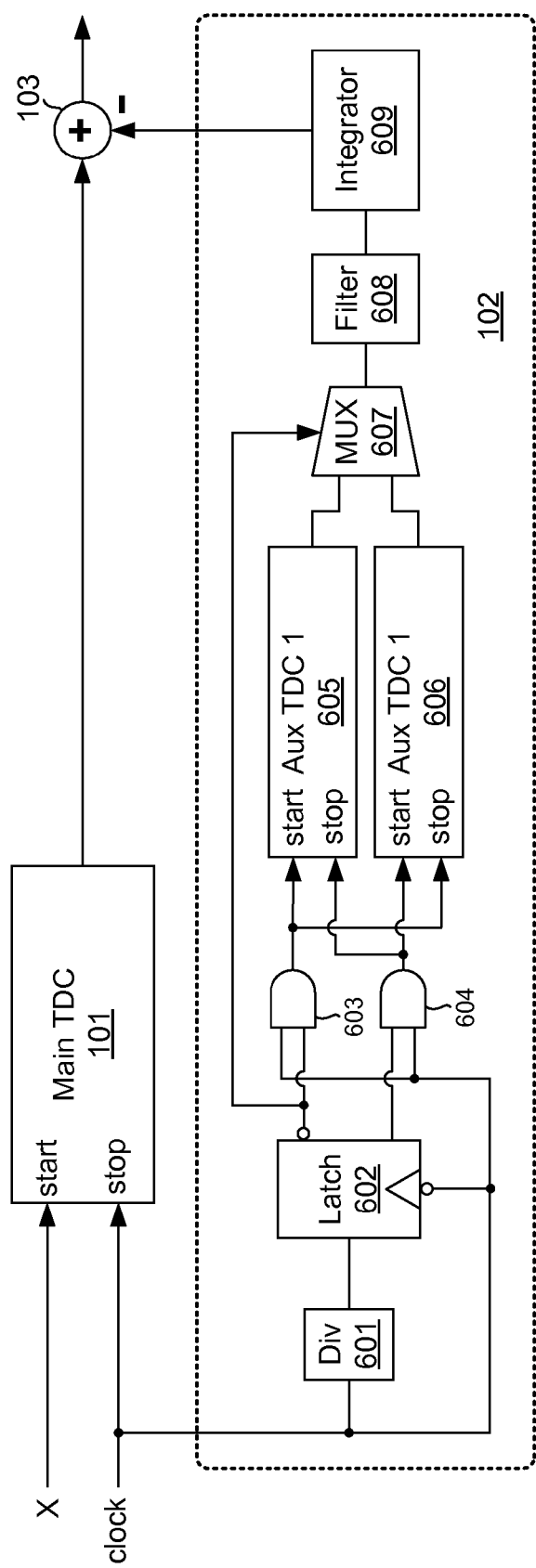

Another illustrative embodiment is shown in FIG. 6. In this example, jitter tracking and estimation unit 102 has a divider 601, a latch 602, two AND gates 603 and 604, a first auxiliary TDC 605, a second auxiliary TDC 606, a multiplexer 607 a filter 608 (such as a low-pass filter), and an integrator 609. In this example, as in others described herein, jitter tracking an estimation unit 102 measures the time interval between two features in the reference clock signal (e.g., a rising edge and the subsequent rising edge). In operation, the first rising edge in the reference clock signal is used as the start signal of first auxiliary TDC 605, and the subsequent rising edge in the reference clock signal is used as the stop signal. Second auxiliary TDC 606 works in the same way as first auxiliary TDC 605, except that the start and stop signals are inverted. Multiplexer 607 alternates between forwarding the output of first auxiliary TDC 605 and the output of second auxiliary TDC 606. This multiplexed signal is then sent through filter 608 and integrator 609 in the same manner as in FIG. 5 (in this example, filter 608 represents filter 403 plus the filter bypass line and combining circuitry 406).

Thus, various illustrative embodiments have been described that perform time interval measurement based on a reference clock, and that further perform the measurement in such a way that at least partially compensates for any jitter in the reference clock.

It is further noted that the above embodiments are merely examples. It is within the scope of this disclosure to combine various aspects of the different embodiments to produce variations thereof. For example, various types of TDCs may be used in the embodiments described herein. Depending upon the type of TDC used, these embodiments may require minor modification, such as to interpret encoded signals received and/or generated by the various functional units. These modifications are well within the capability of one of ordinary skill in the art, without requiring undue experimentation.

The invention claimed is:

1. An apparatus, comprising a circuit configured to determine a jitter of a first signal, to determine a time interval between a feature in a second signal and a feature in the first signal, and to modify the determined time interval based on the determined jitter.

2. The apparatus of claim 1, wherein the apparatus is configured to measure both a period of a first cycle of the first signal and a period of a second cycle of the first signal and determine the jitter based on the measured periods of the first and second cycles.

3. The apparatus of claim 1, wherein the features in the first and second signals are transitions.

4. The apparatus of claim 1, wherein the first signal is a periodic signal except for the jitter.

5. The apparatus of claim 1, further comprising:
a first time-to-digital converter configured to receive the first and second signals and to generate a third signal representing the determined time interval; and
a second time-to-digital converter configured to receive the first signal and to generate a fourth signal, wherein the apparatus is configured to determine the jitter from the fourth signal.

6. The apparatus of claim 1, further comprising:
a first time-to-digital converter configured to receive the first and second signals and to generate a third signal based on the first and second signals; and
a second time-to-digital converter configured to receive the first signal and to generate a fourth signal based on the first signal but not the second signal.

7. The apparatus of claim 6, further comprising:
reformatting circuitry configured to receive and reformat the fourth signal;
a low-pass filter having an input coupled to an output of the reformatting circuitry; and
combining circuitry having a first input coupled to an output of the filter and a second input coupled to an output of the first time-to-digital converter and configured to combine a value represented by a signal received at the first input and a value represented by a signal received at the second input.

8. The apparatus of claim 7, further comprising an integrator having an input coupled to the output of the filter and having an output coupled to the first input of the combining circuitry.

9. The apparatus of claim 1, further comprising:
a multiplexer configured to receive the first and second signals and to selectively output either the first signal or the second signal;
a time-to-digital converter having a first input configured to receive the output of the multiplexer and a second input configured to receive the first signal, and further configured to generate a third signal; and
a demultiplexer configured to receive an output of the time-to-digital converter and to selectively output the third signal to either a first output of the demultiplexer or a second output of the demultiplexer.

10. A method, comprising:
determining a jitter of a first signal;
determining a time interval between a feature in a second signal and a feature in the first signal; and
modifying the determined time interval based on determined jitter.

11. The method of claim 10, wherein determining the jitter comprises:
measuring a length of a first cycle of the first signal;
measuring a length of a second cycle of the first signal; and
determining the jitter based on a combination of the measured lengths of the first and second cycles.

12. The method of claim 10, wherein the features are transitions in the second signal.

13. The method of claim 10, wherein the first signal is a periodic signal except for the jitter.

14. An apparatus, comprising:
a first circuit portion configured to receive a first signal and a second signal, and to generate a third signal based on a time interval between a feature in the first signal and a feature in the second signal;
a second circuit portion configured to determine a jitter of the second signal and to generate a fourth signal representing the determined jitter; and
a third circuit portion configured to generate a fifth signal based on the third and fourth signals.

15. The apparatus of claim 14, wherein the first circuit portion comprises a time-to-digital converter having a start input configured to receive the first signal and a stop input configured to receive the second signal.

16. The apparatus of claim 14, wherein the second circuit portion comprises a time-to-digital converter configured to start a time measurement responsive to the second signal and to stop the time measurement responsive to the second signal.

17. The apparatus of claim 14, wherein the second circuit portion is configured to measure the second signal a plurality of different times and to determine the jitter based on a plurality of measurements of the second signal, the plurality of measurements being taken at different times.

18. The apparatus of claim 14, wherein the third circuit portion is configured to generate the fifth signal by performing one of the following:
summing values represented by the third and fourth signals, or
subtracting a value represented by one of the third and fourth signals from a value represented by the other of the third and fourth signals 19. An apparatus, comprising:
means for determining a jitter of a first signal;
means for determining a time interval between a feature in a second signal and a feature in the first signal;and
means for modifying the determined time interval based on the determined jitter.

20. An apparatus, comprising:
- a first circuit portion configured to determine a time interval between a feature in a first signal and a feature in a second signal;
- a second circuit portion configured to determine a jitter of the second signal; and
- a third circuit portion configured to modify the determined time interval by the determined jitter.

21. The apparatus of claim 20, wherein the second circuit portion is configured to start a time measurement responsive to the second signal and to stop the time measurement responsive to the second signal.

22. The apparatus of claim 21, wherein the first circuit portion comprises a first time-to-digital converter having a start input configured to receive the first signal and a stop input configured to receive the second signal.

23. The apparatus of claim 21, wherein the second circuit portion further comprises:
- a low-pass filter configured to receive a signal representing the time measurement made by the second circuit portion; and
- circuitry configured to determine a difference between a value represented by an output of the low-pass filter and the time measurement made by the second circuit portion.

24. The apparatus of claim 20, wherein the first circuit portion comprises:
- a fourth circuit portion configured to alternately select between the first signal and the second signal; and
- a time-to-digital converter having a first input coupled to the fourth circuit portion and to receive the selected one of the first signal and the second signal, and a second input configured to receive the second signal.

25. The apparatus of claim 24, wherein the second circuit portion also comprises the time-to-digital converter.

* * * * *